United States Patent [19]
Lee et al.

[11] Patent Number: 5,790,458
[45] Date of Patent: Aug. 4, 1998

[54] SENSE AMPLIFIER FOR NONVOLATILE SEMICONDUCTOR MEMORY DEVICE

[75] Inventors: Sung-Soo Lee, Seoul; Kang-Deog Suh, Kyungki-do, both of Rep. of Korea

[73] Assignee: Samsung Electronics Co., Ltd., Suwon, Rep. of Korea

[21] Appl. No.: 680,055

[22] Filed: Jul. 15, 1996

[30] Foreign Application Priority Data

Jul. 15, 1995 [KR] Rep. of Korea ............... 20913/1995

[51] Int. Cl.$^6$ ............................................. G11C 7/00
[52] U.S. Cl. .......................... 365/185.21; 365/189.04; 365/205
[58] Field of Search ........................... 365/189.04, 205

[56] References Cited

U.S. PATENT DOCUMENTS

| | | | |
|---|---|---|---|
| 4,739,499 | 4/1988 | Simpson | 365/205 |
| 4,804,871 | 2/1989 | Walters, Jr. | 365/205 |
| 5,311,471 | 5/1994 | Matsumoto et al. | 365/189.05 |
| 5,361,227 | 11/1994 | Tanaka et al. | 365/200 |
| 5,381,363 | 1/1995 | Bazes | 365/189.04 |
| 5,491,667 | 2/1996 | Sharp | 365/189.05 |

OTHER PUBLICATIONS

Article: A Novel Sense Amplifier for Flexible Voltage Operation NAND Flash Memories, *1995 Symposium on VLSI Circuits Digest of Technical Papers*, by Hiroshi Nakamura, Junichi Miyamoto, Kenichi Imamiya and Yoshihisa Iwata, pp. 71–72.

*Primary Examiner*—David C. Nelms
*Assistant Examiner*—Michael T. Tran
*Attorney, Agent, or Firm*—Marger, Johnson, McCollom & Stolowitz, P.C.

[57] ABSTRACT

A sense amplifier for transferring data between a data input/output line and a bit line in a nonvolatile semiconductor memory device includes two isolated current paths to prevent data collisions. A transistor transfers a bit of input data from the data input/output line to a first terminal of a two-terminal latch in response to a load control signal. The second terminal of the latch is connected to the bit line. A second transistor transfers a bit of output data from the second terminal of the latch to the data input/output line in response to a read control signal. While the bit of input data is being transferred, the second transistor isolates the second terminal of the latch from the data input/output line.

20 Claims, 3 Drawing Sheets

SENSE AMPLIFIER FOR NONVOLATILE SEMICONDUCTOR MEMORY DEVICE

BACKGROUND OF THE INVENTION

1. Field of the Invention

This invention relates generally to semiconductor memory devices and more particularly to advanced sense amplifiers for nonvolatile semiconductor memory devices having NAND structured memory cell arrays.

This application corresponds to Korean Patent Application No. 20913/1995 filed Jul. 15, 1995 in the name of Samsung Electronics Co, Ltd. which is herein incorporated by reference.

2. Description of the Related Art

Sense amplifier circuits employed in nonvolatile memory devices typically include page buffers (or data latches) in addition to the usual sense amplifier circuitry. For example, page buffers are typically used in NAND flash memories (i.e., flash EEPROMs with NAND-structured cell arrays) in which every bit line in a cell array matrix is coupled to a corresponding sense amplifier. During a read operation, data bits from memory cells are stored at appropriate voltage levels in the sense amplifier circuitry. The sense amplifier circuitry also maintains the voltage levels of input data bits used in program mode and program inhibit mode. It is well known that, in devices having plural bit lines, the plural sense amplifiers and page buffers corresponding to the plural bit lines take up a large amount of chip area and do not achieve a high density level.

FIG. 1 shows the configuration of a flash memory device including sense amplifiers as described above, which was described in an article entitled "A Novel Sense Amplifier for Flexible Voltage Operation NAND Flash Memories" published in the IEEE 1995 Symposium on VLSI Circuits Digest of Technical Papers. In FIG. 1, reference numerals 10 and 20 denote the sense amplifier and memory cell string, respectively. The sense amplifier 10 includes pass transistors N2 and N3 with drain nodes coupled to a pair of data input/output lines I/O and /I/O. Latch 11 is constructed of two p-channel MOSFETs and two n-channel MOSFETs cross-coupled therebetween. Transistors N4, N5 and N1 are used for sensing data, while pass transistor N6 transfers the input data bit to a corresponding bit line during a program operation. P-channel MOSFET P1 is used for charging the bit line to a predetermined precharge level.

Column selection signal CSL, which is applied to the gates of the pass transistors N2 and N3, enables sense data from a selected bit line to be transferred to the data input/output lines I/O and /I/O. The column selection signals in a memory device must be controlled independently of each other. For example, a memory array with 2k columns and 8 input/output lines may employ 256 bus lines for the column selection signals. The number of bus lines will increase as the capacity of the memory array increases, thus using a greater amount of chip area.

The latch 1, which includes two inverters made with four cross-coupled transistors, performs a page copy function during a program operation. The transistors in the latch 11 need to have channel widths that are wider than those of other transistors in order to have enough current drive capacity to drive the bit line to the program inhibit voltage during the program operation. The transistors must also have enough current capacity to drive data signals during a read operation and during the program inhibit operation after programming. Therefore, the latch occupies a large amount of chip area compared to the other circuit elements on the chip.

The prior art sense amplifier shown in FIG. 2 uses less chip area than the circuit of FIG. 1. The circuit of FIG. 2 includes column selection transistors N21 and N22 which connect a selected bit line B/L to a data input/output line I/O through the sense amplifier. A tri-state inverter INV3 controls the data output from the sense amplifier to the input/output line I/O during read operations. A pass transistor N24 controls the data input during program operations. A latch L1 formed by inverters INV1 and INV2 stores data to be used in program operations. Transistors N25, N26 and D1 all control the bit line B/L, while pull-down transistors N27 and N28 enable sense data to be stored in the latch during the read operation. Bit line discharging transistor N29 and input transistor P1 transfer power supply voltage Vcc to the sense amplifier in response to a sensing control signal $\phi S$. The node SO is driven to a high logic level for a memory cell in the on state and a low logic level for a cell in the off state.

Column selection signals YBj and YAi, which are generated by a column decoder (not shown), are applied to the gates of the transistors N21 and N22, respectively, and provide the memory cell array with column decoding signals using column address signals. Assuming a memory device with 2k (2048) column lines and 8 input/output lines, the number of bus lines required for column selection signals YBj and YAi is 16. Thus, by using a single input/output line per bit, the circuit of FIG. 2 requires fewer bus lines than the circuit shown in FIG. 1 which required 256.

A problem with the circuit of FIG. 2 is that the tri-state inverter INV3 must have a high current drive capacity. As data stored in the latch L1 is applied to the input/output line I/O through the tri-state inverter INV 3, and while input data to be programmed into a memory cell is transferred through the pass transistor N24 and then stored in the latch L1, the tri-state inverter INV3 must have a high enough current drive to maintain valid read voltages on the input/output line I/O after driving a signal through the two column selection transistors N22 and N21. Thus, the tri-state inverter INV3 is constructed from four FET transistors all of which are larger relative to the other transistors on the memory chip. This results in an increase in the size of the chip.

A further problem with the circuit of FIG. 2 is that, during a loading operation, when a data bit from the input/output line I/O is coupled through transistor N24 to the node SO, the loaded data bit collides with the data bit stored in the latch L1, resulting in a conflicting data condition.

Accordingly, a need remains for a sense amplifier circuit which overcomes the problems discussed above.

SUMMARY OF THE INVENTION

It is, therefore, an object of the invention to provide a sense amplifier that requires a reduced amount of semiconductor chip area.

Another object of the invention is to provide a sense amplifier that does not cause data collisions.

A further object of the invention is to sense and store data in a semiconductor memory device without using a tri-state inverter.

A sense amplifier according to the present invention transfers data between a data input/output line and a bit line in a nonvolatile semiconductor memory device using two isolated current paths to prevent data collisions. A transistor transfers a bit of input data from the data input/output line to a first terminal of a two-terminal latch in response to a load control signal. The second terminal of the latch is connected to the bit line. A second transistor transfers a bit of output data from the second terminal of the latch to the data input/output line in response to a read control signal. While the bit of input data is being transferred, the second transistor isolates the second terminal of the latch from the data input/output line.

One aspect of the present invention is a sense amplifier for a nonvolatile semiconductor memory device comprising: a latch having first and second terminals, the first terminal coupled to a bit line; a first current path coupled between a data input/output line and the first terminal of the latch; and a second current path coupled between the data input/output line and the second terminal of the latch. The first current path includes a transistor having a drain-source path coupled between the data input/output line and the first terminal of the latch, and the second current path includes a transistor having a drain-source path coupled between the data input/ output line and the second terminal of the latch.

Another aspect of the present invention is a sense amplifier for a nonvolatile semiconductor memory device having a data input/output line and a memory cell coupled to a bit line, the sense amplifier comprising: storage means for storing logic data for programming the memory cell through the bit line during a program operation; first coupling means for coupling data from the bit line to the data input/output line to during the read operation; and second coupling means for coupling data from the data input/output line to the storage means during the load operation, the second coupling means being isolated from the first coupling means. The first coupling means couples data from the bit line to the data input/output line responsive to a read control signal, and the second coupling means couples data from the data input/output line to the storage means responsive to a load control signal.

Another aspect of the present invention is a method for transferring data between a data input/output line and a bit line in a nonvolatile semiconductor memory device having a latch, the latch having first and second terminals, the first terminal coupled to the bit line, the method comprising: generating a load control signal during a loading operation; coupling a data signal from the data input/output line to the second terminal of the latch responsive to the load control signal; generating a read control signal during a read operation; coupling a data signal from the first terminal of the latch to the data input/output line responsive to the read control signal; and isolating the first terminal of the latch from the data input/output line during the loading operation.

The foregoing and other objects, features and advantages of the invention will become more readily apparent from the following detailed description of a preferred embodiment of the invention which proceeds with reference to the accompanying drawings.

DETAILED DESCRIPTION

Figure 1:
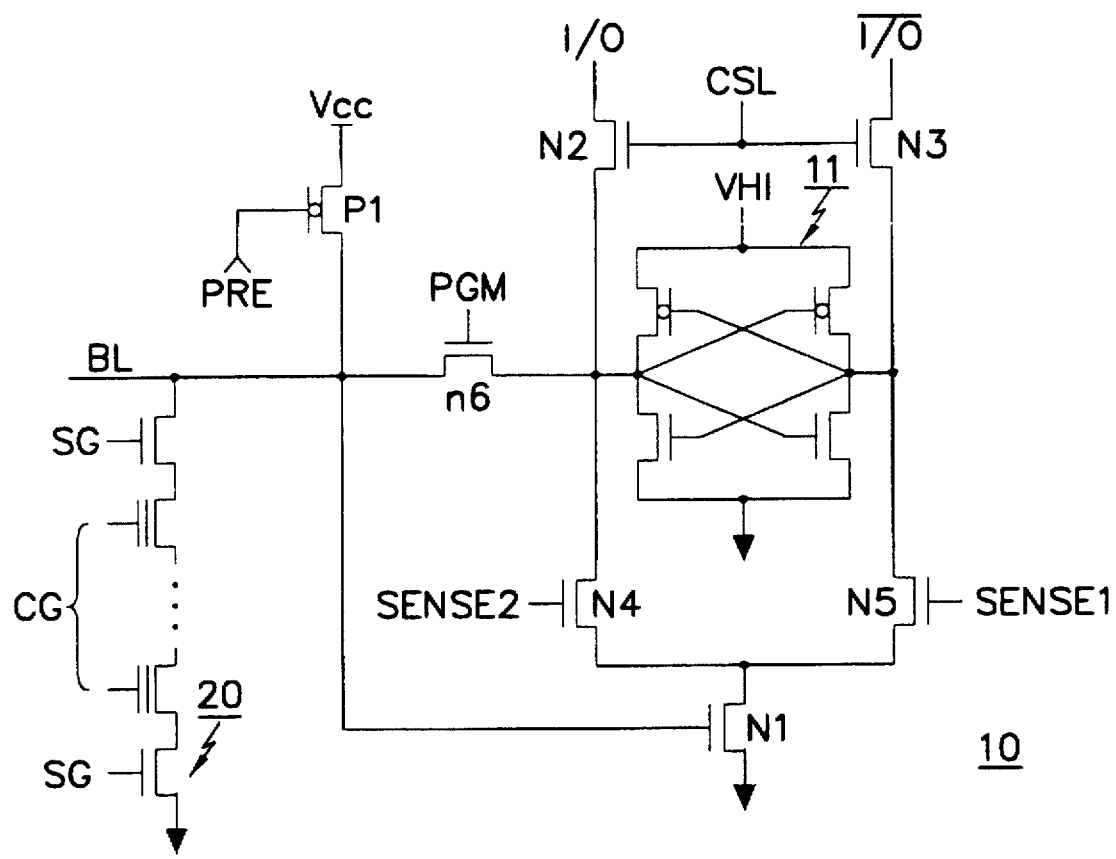
FIG. 1 is a schematic diagram of a prior art sense amplifier circuit using two data input/output lines.
Figure 2:
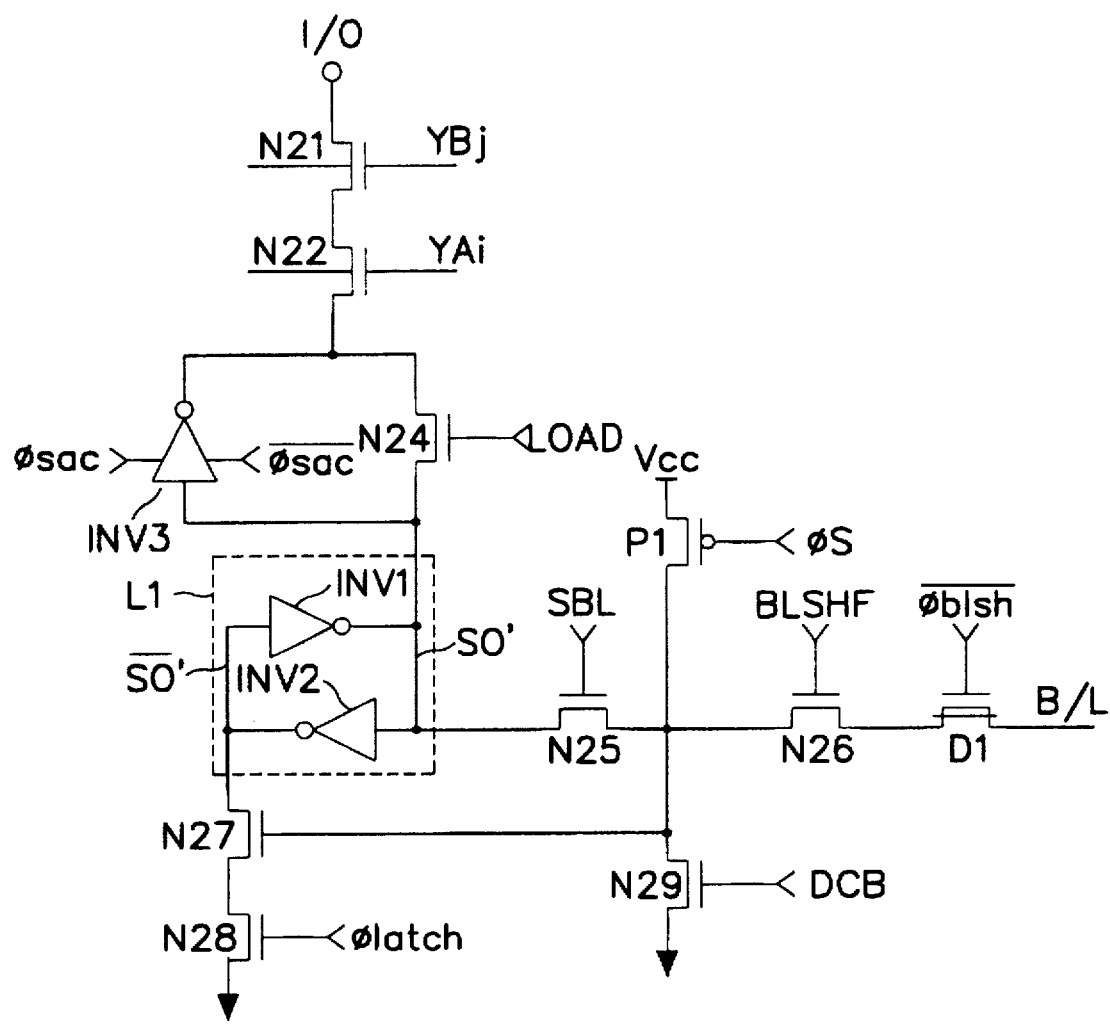
FIG. 2 is a schematic diagram of a prior art sense amplifier circuit using a single data input/output line.
Figure 3:
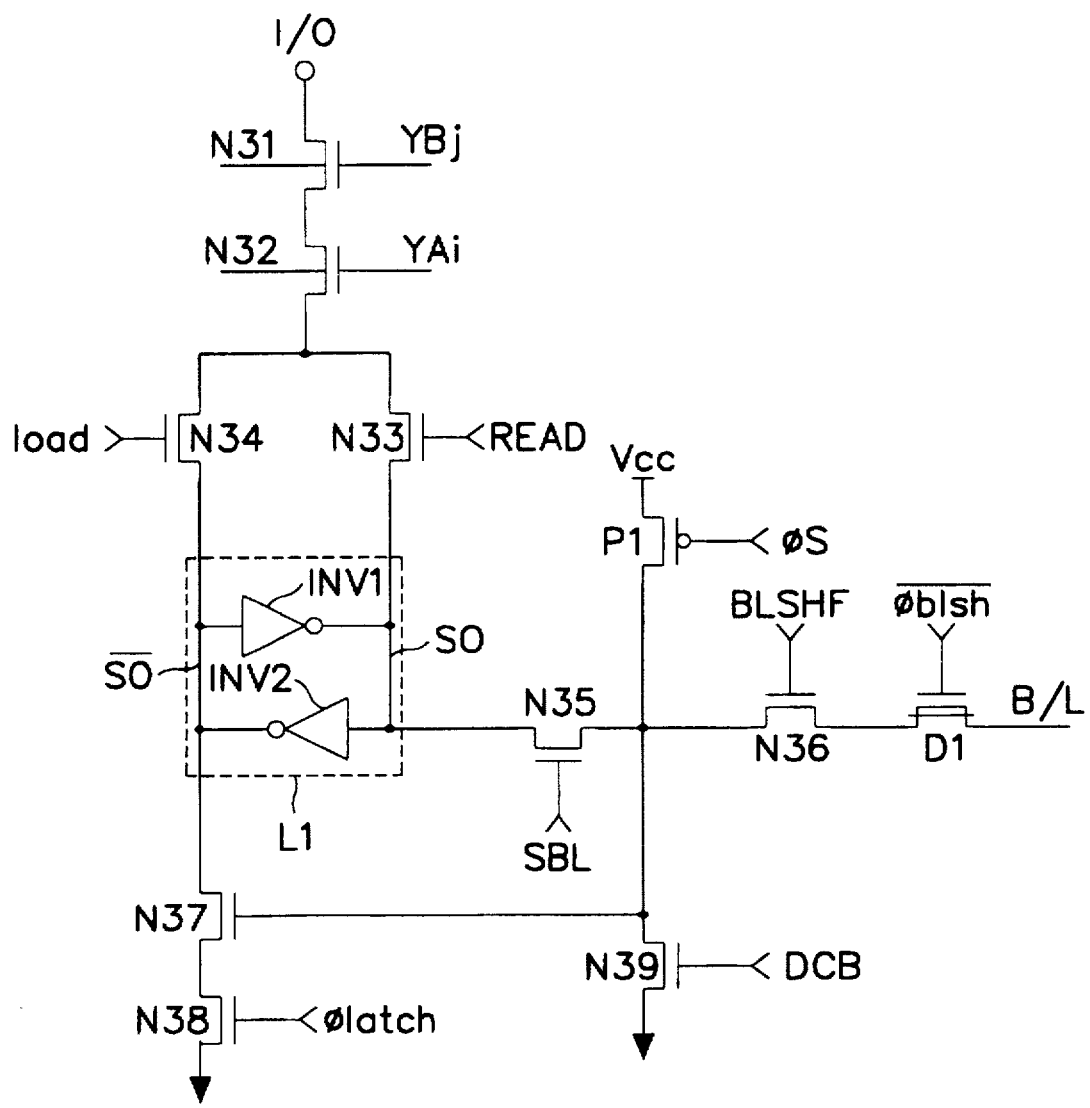
FIG. 3 is a schematic diagram of an embodiment of a sense amplifier circuit in accordance with the present invention.

FIG. 3 is a schematic diagram of an embodiment of a sense amplifier circuit in accordance with the present invention. The structure of the sense amplifier of FIG. 3 will be described and then a description of the operation will be provided.

Referring to FIG. 3, the sense amplifier includes a latch L1 having two terminals. Latch L1 is formed from two inverters INV1 and INV2. The output terminal of INV1 is connected to the input terminal of INV2 and forms the first terminal of the latch L1. The first terminal of the latch also forms a node SO. The input terminal of INV1 is connected to the output terminal of INV2 which forms the second terminal of latch L1 and a node /SO. Latch L1 may also be referred to as a page buffer connected between SO and /SO.

An NMOS data read pass transistor N33 has a first terminal of its drain-source path connected to node SO and a gate terminal connected to a read control signal READ. An NMOS data load pass transistor N34 has a first terminal of its drain-source path connected to node /SO and a gate terminal connected to a load control signal LOAD. The second terminal of the drain-source path of transistor N33 and the second terminal of the drain-source path of transistor N34 are connected together.

A first column select transistor N31 has a first terminal of its drain-source path connected to a data input/output line I/O and a gate terminal connected to a column select signal YBj. A second column select transistor N32 has its drain-source path connected between the second terminal of the drain-source path of transistor N31 and the second terminal of the drain-source path of transistor N33. The gate of transistor N32 is connected to a column select signal YAi.

An NMOS transistor N35 has a first terminal of its drain-source path connected to node SO and a gate connected to a signal /SBL. A depletion mode transistor D1 has a first terminal of its drain-source path connected to bit line B/L and a gate terminal connected to a signal /φblsh. An NMOS transistor N36 has its drain-source path connected in series between the second terminal of the drain-source path of transistor N35 and the second terminal of the drain-source path of transistor D1. The gate terminal of N36 is connected to a signal BLSHF.

A PMOS transistor P1 has its drain-source path connected between a power supply node Vcc and the second terminal of the drain-source path of N35, and its gate connected to a signal φS. An NMOS transistor N39 has its drain-source path connected between a ground node and the second terminal of the drain-source path of N35, and its gate connected to a signal DCB. An NMOS transistor N38 has a first terminal of its drain-source path connected to the ground node and its gate terminal connected to a signal φlatch. An NMOS transistor N37 has its drain-source path connected between the second terminal of the drain-source path of N38 and node /SO. The gate of N37 is connected to the second terminal of the drain-source path of N35.

Transistors N35, N36 and D1 all control the bit line B/L. In an application where there are 256 bit lines, the sense amplifier of FIG. 3 is connected one by one to each of the bit lines related to the corresponding row block. The signal /φblsh at the gate of D1 is maintained in a logic "high" state of about 5 volts during program operations. The signal control signal SBL at the gate of N35 is also maintained in the logic "high" state during program operations. Pull-down transistors N37 and N38 enable sense data to be stored in the latch during the read operation. Bit line discharging transistor N39 and input transistor P1 transfer power supply voltage Vcc to the sense amplifier in response to a sensing control signal φS. The node SO is driven to a high logic level for a memory cell in the on state and a low logic level for a cell in the off state.

Column selection signals YBj and YAi, which are generated by a column decoder (not shown), are applied to the gates of the transistors N31 and N32, respectively, and provide the memory cell array with column decoding signals using column address signals.

In operation, transistor N33 forms a first current path for controlling the data output in response to the read control signal READ during read operations, and transistor N34 forms a second isolated current path for controlling data input in response to the load control signal LOAD during program operations. Thus, data is transferred between the data input/output line and the bit line through two independent paths.

The latch L1 is used as a page buffer for temporarily storing data that is simultaneously written into the memory cells through each corresponding bit line during the program operation. The latch L1 is also used as a verification detector for verifying the programmed state of a memory cell during a program verification operation. The latch is further used as a sense amplifier for sensing and amplifying data from the memory cells through the bit lines during the read operation.

An advantage of the embodiment of the sense amplifier shown in FIG. 3 is that transistors N33 and N34 allow the sense amplifier to be used as a buffer amplifier during program verification operations and read operations without the use of a tri-state inverter. A tri-state inverter, which requires four transistor to implement, is replaced by a single pass transistor N33 in the present invention. This eliminates three transistors for each one of the page buffers, and the chip area required for the sense amplifier is reduced accordingly.

Another advantage of the present invention is that the data input and output paths are isolated. Thus, data collisions during data load operations are eliminated.

A further advantage of the present invention is that the channel size of the transistors forming the inverter type latch can be reduced without limiting the operation of the sense amplifier. This results in additional savings of chip area.

Having described and illustrated the principles of the invention in a preferred embodiment thereof, it should be apparent that the invention can be modified in arrangement and detail without departing from such principles. I claim all modifications and variations coming within the spirit and scope of the following claims.

We claim:

1. A sense amplifier for a nonvolatile semiconductor memory device comprising:

a bit line;

a latch having first and second terminals, the first terminal coupled to the bit line;

a data input/output line;

a first controlled current path coupled between the data input/output line and the first terminal of the latch; and a second controlled current path coupled between the data input/output line and the second terminal of the latch, wherein the second controlled current path can be controlled separately from the first controlled current path.

2. A sense amplifier according to claim 1 wherein the first controlled current path includes a transistor having a drain-source path coupled between the data input/output line and the first terminal of the latch.

3. A sense amplifier for a nonvolatile semiconductor memory device comprising:

a bit line;

a latch having first and second terminals, the first terminal coupled to the bit line;

a data input/output line;

a first current path coupled between the data input/output line and the first terminal of the latch; and a second current path coupled between the data input/output line and the second terminal of the latch;

the first current path including a transistor having a drain-source path coupled between the data input/output line and the first terminal of the latch and having a gate terminal coupled to a read control signal.

4. A sense amplifier according to claim 1 wherein the second controlled current path includes a transistor having a drain-source path coupled between the data input/output line and the second terminal of the latch.

5. A sense amplifier for a nonvolatile semiconductor memory device comprising:

a bit line;

a latch having first and second terminals, the first terminal coupled to the bit line;

a data input/output line;

a first current path coupled between the data input/output line and the first terminal of the latch; and a second current path coupled between the data input/output line and the second terminal of the latch;

the second current path including a transistor having a drain-source path coupled between the data input/output line and the second terminal of the latch and having a gate terminal coupled to a load control signal.

6. A sense amplifier according to claim 1 wherein the latch includes:

a first inverter having an output terminal coupled to the first terminal of the latch and an input terminal coupled to the second terminal of the latch; and a second inverter having an input terminal coupled to the first terminal of the latch and an output terminal coupled to the second terminal of the latch.

7. A sense amplifier according to claim 1 further including a first column select transistor having a drain-source path coupled between the data input/output line and the first controlled current path.

8. A sense amplifier for a nonvolatile semiconductor memory device comprising:

a bit line;

a latch having first and second terminals, the first terminal coupled to the bit line;

a data input/output line;

a first current path coupled between the data input/output line and the first terminal of the latch;

a second current path coupled between the data input/output line and the second terminal of the latch;

a first column select transistor having a drain-source path coupled between the data input/output line and the first current path; and a second column select transistor having a drain-source path coupled between the data input/output line and the first column select transistor.

9. A sense amplifier for a nonvolatile semiconductor memory device comprising:

a data input/output line;

a bit line;

a memory cell coupled to the bit line;

storage means for storing data for programming the memory cell through the bit line during a program operation;

first coupling means for coupling data from the bit line to the data input/output line during the read operation; and second coupling means for coupling data from the data input/output line to the storage means during the load operation, the second coupling means being isolated from the first coupling means.

10. A sense amplifier according to claim 9 wherein the first coupling means couples data from the bit line to the data input/output line responsive to a read control signal.

11. A sense amplifier according to claim 9 wherein the second coupling means couples data from the data input/output line to the storage means responsive to a load control signal.

12. A sense amplifier according to claim 9 wherein the storage means includes a latch.

13. A sense amplifier according to claim 9 further including sensing means for sensing and amplifying data from the memory cell through the bit line during a read operation.

14. A sense amplifier according to claim 13 wherein a latch forms the storage means and the sensing means.

15. A method for transferring data between a data input/output line and a bit line in a nonvolatile semiconductor memory device having a latch, the latch having first and second terminals, the first terminal coupled to the bit line, the method comprising:

generating a load control signal during a loading operation;

coupling a first data signal from the data input/output line to the second terminal of the latch responsive to the load control signal;

generating a read control signal during a read operation;

coupling a second data signal from the first terminal of the latch to the data input/output line responsive to the read control signal; and isolating the first terminal of the latch from the data input/output line during the loading operation.

16. A method according to claim 15 further including isolating the second terminal of the latch from the data input/output line during the read operation.

17. A method according to claim 15 further including using the latch to sense a third data signal from the bit line during a read operation.

18. A method according to claim 15 further including using the latch to amplify a third data signal from the bit line during a read operation.

19. A method according to claim 15 further including using the latch as a detector to verify the programming operation during a program verify operation.

20. A method according to claim 15 further including using a pair of pass transistors to buffer a data signal during a program verify operation or a read operation.

* * * * *